United States Patent [19]

Wichern

[11] Patent Number: 5,235,277

[45] Date of Patent: Aug. 10, 1993

[54] SURFACE COIL FOR MAGNETIC RESONANCE EXAMINATIONS

[75] Inventor: Andreas Wichern, Hamburg, Fed. Rep. of Germany

[73] Assignee: U.S. Philips Corporation, New York, N.Y.

[21] Appl. No.: 713,185

[22] Filed: Jun. 10, 1991

[30] Foreign Application Priority Data

Jun. 15, 1990 [DE] Fed. Rep. of Germany ....... 4019046

[51] Int. Cl.$^5$ .............................................. G01R 33/20
[52] U.S. Cl. ..................................... 324/318; 324/322
[58] Field of Search ................. 128/653; 324/300, 307, 324/309, 318, 322

[56] References Cited

U.S. PATENT DOCUMENTS

| 4,906,933 | 3/1990 | Keren ................................. 324/318 |
| 4,924,868 | 5/1990 | Krause et al. ...................... 128/653 |
| 4,928,064 | 5/1990 | Keren ................................. 324/322 |
| 4,998,066 | 3/1991 | Wichern et al. ................... 324/322 |
| 5,030,915 | 7/1991 | Boskamp et al. .................. 324/318 |
| 5,097,210 | 3/1992 | Requardt et al. .................. 324/318 |

FOREIGN PATENT DOCUMENTS 0280908  9/1988  European Pat. Off. .

*Primary Examiner*—Michael J. Tokar

[57] ABSTRACT

A surface coil for magnetic resonance examinations is formed by two longitudinal conductors and a plurality of transverse conductors which interconnect the longitudinal conductors in a plane. A coupling device couples the coil to an RF transmitter or an RF receiver. An RF magnetic field is produced by the coil parallel to the plane defined by the transverse conductors. The transverse conductors each include at least one capacitor. One of the two outer transverse conductors forms a part of the coupling device. The conductors and the capacitors are proportioned and have values so that the current through the outer transverse conductor forming a part of the coupling device is uniformly distributed between the other transverse conductors.

18 Claims, 2 Drawing Sheets

SURFACE COIL FOR MAGNETIC RESONANCE EXAMINATIONS

FIELD OF THE INVENTION

This invention relates to a surface coil for magnetic resonance examinations which comprises two longitudinal conductors and several transverse conductors for interconnecting the longitudinal conductors, and also comprises a coupling device for connection to an RF transmitter or an RF receiver.

BACKGROUND OF THE INVENTION

A surface coil of this kind is known from EP-A 280 908 which corresponds to U.S. Pat. No. 4,924,868. Therein, the transverse conductors are connected to the longitudinal conductors via electronic switches so that the effective surface of such a coil depends on which switches are closed. One of the two longitudinal conductors therein forms a part of a coupling device for connecting the surface coil to an RF transmitter or an RF receiver.

The known surface coil is suitable for generating RF magnetic fields which extend perpendicularly to the surface defined by the longitudinal and transverse conductors and for receiving such fields.

During magnetic resonance examinations, the patient to be examined is exposed to a strong, steady, uniform magnetic field. The magnet for this steady magnetic field is generally shaped as a hollow cylinder in which the patient to be examined is introduced so that the longitudinal axis of the patient extends parallel to or is coincident with the axis of the hollow cylinder.

For the excitation of spin resonance phenomena and for the reception of spin resonance signals it is necessary that the magnetic fields (to be generated or received) extend perpendicular to the steady magnetic field. In general this condition can be suitably satisfied by means of the known surface coil when it is arranged on the surface of the body of the patient and when the uniform, steady magnetic field extends in the direction of the cylinder axis as is customary thus far. This is because the RF magnetic field generated by the surface coil then extends perpendicular to the surface of the patient and hence also perpendicular to the direction of the axis of the hollow cylinder and the direction of the steady magnetic field.

However, recently magnets have appeared which also have the shape of a hollow-cylinder but which generate a steady magnetic field which extends perpendicular to the axis of the hollow cylinder and hence perpendicular to the longitudinal axis of the patient. When the known surface coil is used in such a magnet, the condition of orthogonality between the steady field and the RF magnetic field can no longer be satisfied in all cases.

SUMMARY OF THE INVENTION

It is an object of the present invention to provide a surface coil which can be used in such cases.

This object is achieved in accordance with the invention in that each of the transverse conductors comprise at least one capacitor, one of the two outer transverse conductors forming a part of the coupling device, the conductors and the capacitors being proportioned so that the current through the transverse conductor forming a part of the coupling device is uniformly distributed between the other transverse conductors.

In accordance with the invention, the current through the transverse conductor forming a part of the coupling device is uniformly distributed between the other transverse conductors. The currents through these transverse conductors produce RF magnetic fields which are oppositely oriented at the area between the transverse conductors but are oriented in the same direction outside the surface (preferably a plane) defined by the transverse conductors. The magnetic field resulting from the superposition of the magnetic field thus extends parallel to the surface of the transverse conductors, as opposed to the known surface coil in which the RF magnetic field extends perpendicular to this surface. When this coil is oriented so that during operation the longitudinal conductors extend parallel to the longitudinal direction of the patient, the RF magnetic field will extend perpendicular to the steady field of a magnet when the latter field extends perpendicular to the cylinder axis of the magnet.

IN THE DRAWING

The invention will be described in detail hereinafter with reference to the accompanying drawings, in which.

DESCRIPTION OF THE PREFERRED EMBODIMENTS

Figure 1:
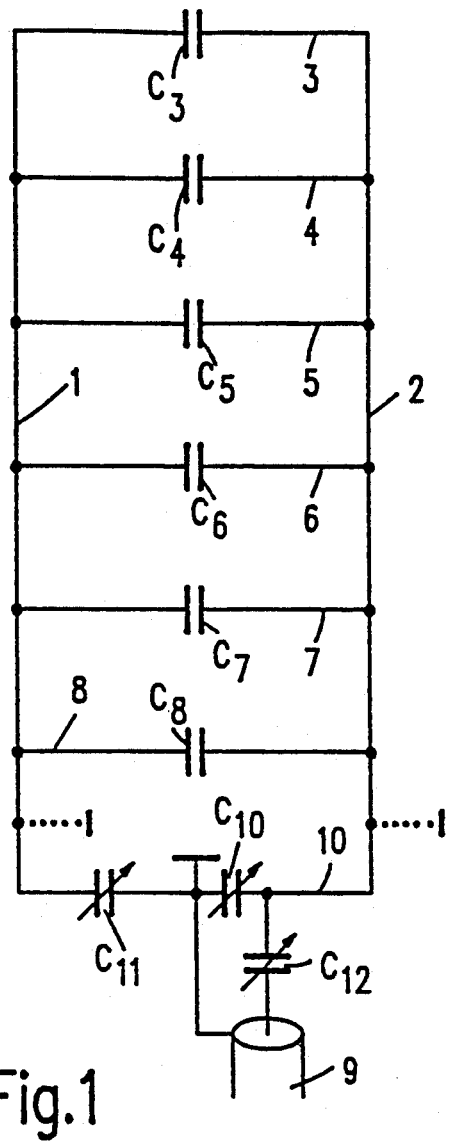
FIG. 1 is a plan view of a surface coil in accordance with the invention.

The reference numerals 1 and 2 in FIG. 1 denote two preferably rectilinear and parallel conductors. Hereinafter, these conductors will also be referred to as longitudinal conductors. The longitudinal conductors are interconnected by way of a number (six in the present example) of conductors 3 . . . 8 which are referred to hereinafter as transverse conductors. The transverse conductors 3 . . . 8 extend parallel to one another and define a plane; they are preferably situated at the same distance from one another. Each of the transverse conductors 3 . . . 8 includes a corresponding respective capacitor $C_3$ . . . $C_8$. The longitudinal conductors 1, 2 are also interconnected at one end thereof via a further transverse conductor 10. The latter conductor includes two serial coupled variable capacitors $C_{10}$, $C_{11}$ whose junction is connected to ground and to the ground conductor of coaxial cable 9. The terminal of capacitor $C_{10}$ connected to conductor 2 is also connected to the center conductor of coaxial cable 9 via a variable capacitor $C_{12}$. This transverse branch formed by conductor 10 couples the surface coil, via the coaxial cable 9, to an RF transmitter or RF receiver (not shown). The capacitor $C_{12}$ serves for adaptation to the characteristic impedance of the cable 9 and the capacitors $C_{10}$, $C_{11}$ serve for tuning to the operating frequency of the coil formed by conductors 1 . . . 8. The conductors 3 . . . 8, 10 may be rigid or flexible. In the latter case, however, it is no longer ensured that the transverse conductors 3 . . . 8 define a plane and extend parallel to one another.

The capacitors $C_3$ . . . $C_8$ as well as $C_{10}$ . . . $C_{12}$ have valves so that, when they are fed by an RF transmitter with the (Larmor) frequency used for the examination, all currents through the transverse conductors 3 . . . 8 have the same intensity and phase position, so that the sum of these currents corresponds to the current through the transverse conductor 10. A respective virtual ground point then arises on the longitudinal conductors halfway between the transverse conductor 10 and the neighboring transverse conductor 8, represented by the symbols coupled to conductors 1 and 2 in the region between conductors 8 and 10 i.e. the voltage has a minimum value at that area. In order to ensure that the currents through the transverse conductors 3 ... 8 remain constant despite this voltage distribution, the capacitance of the capacitor $C_8$ must be highest and that of the capacitor $C_3$ must be lowest. The capacitance $C_{11}$ in series with $C_{10}$, $C_{12}$ should be in the order of magnitude of the sum of the capacitances $C_3 \ldots C_8$.

Figure 2:
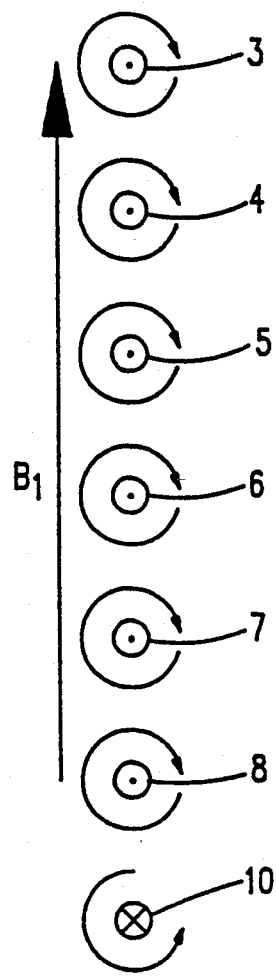
FIG. 2 is a lateral cross-sectional view of such a coil.

FIG. 2 is a cross-sectional view of the transverse conductors 3 ... 10 and also shows the magnetic fields arising from the currents through the transverse conductors as well as the resultant magnetic field $B_1$. The currents through the transverse conductors each produce a corresponding magnetic field which encloses the relevant conductor and which comprises a horizontal and a vertical component. Halfway between two neighboring transverse conductors the horizontal components oppose and thus compensate for one another, whereas at opposing sides of the plane defined by the transverse conductors in a direction from the bottom to the top of the drawing figure, the vertical components are summed due to superposition; this results in an RF magnetic field B, which extends parallel to the plane of the transverse conductors and perpendicular (vertically) to the transverse conductors.

Currents of different value flow in opposite directions through the neighboring conductors 8 and 10. Therefore, the resultant magnetic field (not shown at this area) does not have the same strength and direction as the magnetic field $B_1$. The same is true for the magnetic fields produced by the longitudinal conductors 1, 2. In order to eliminate their effects, shielded conductors can be used for the two longitudinal conductors and the transverse conductor 10.

Figure 3:
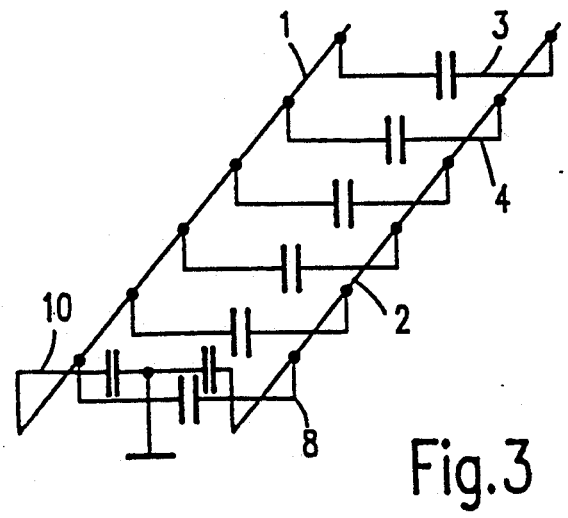
FIG. 3 is an isometric view of an effective alternative version of the coil, of FIG. 1

FIG. 3 shows a different solution to this problem. The transverse conductors 3 ... 8 are now situated below the plane defined by the longitudinal conductors 1, 2, the transverse conductor 10 being situated above that plane. The transverse conductors are each connected to the longitudinal conductors via conductor ends which are directed upwards and downwards, respectively. The magnetic fields associated with the currents through the longitudinal conductors and the transverse conductor 10 now have a reduced effect only in the zone below the plane defined by the transverse conductors 3 ... 8.

Figure 4:
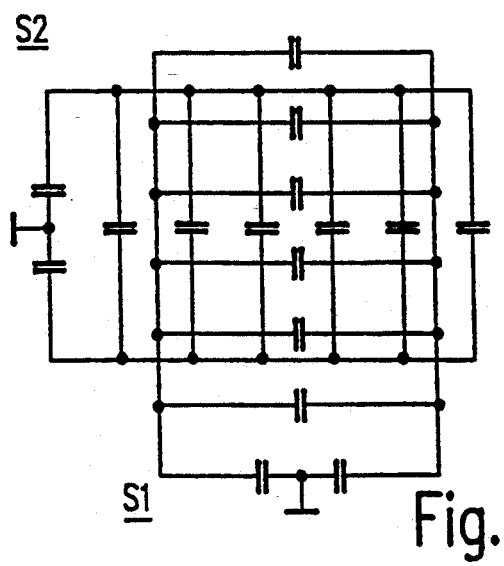
FIG. 4 shows a quadrature coil system.

FIG. 4 shows a quadrature coil system which comprises two surface coils as shown in FIG. 1 or FIG. 3. The two surface coils have been rotated through 90° with respect to one another so that the planes defined by the respective transverse conductors thereof extend parallel to one another.

Even though the two quadrature coils $S_1$, $S_2$ generate RF magnetic fields which extend parallel to the planes defined by the transverse conductors, in practice a given coupling between the two coil systems is inevitable. As a result, the known advantages of a quadrature coil over a single coil are lost. However, this can be prevented by interconnecting the two surface coils $S_1$ and $S_2$ via a capacitor which is proportioned so that the current produced thereby exactly compensates for the current produced by the magnetic coupling. This is described in detail in German Patent Application P 38 20 168 which corresponds to U.S. Pat. No. 4,998,066 Mar. 5, 1991.

The quadrature coil system shown in FIG. 4 can be advantageously used in a magnet where the axis of the hollow cylinder extends horizontally and whose steady magnetic field extends perpendicular to that axis. It need then merely be arranged on the table top on which the patient is positioned.

What is claimed is:

1. A surface coil system for magnetic resonance examinations comprising:
   two longitudinal conductors;
   a plurality of transverse conductors interconnecting the longitudinal conductors to form a surface coil; and
   coupling means for coupling the coil formed by said conductors to an RF transmitter or RF receiver, a plurality of capacitors arranged so that said transverse conductors each include at least one capacitor, said coupling means including an outer transverse conductor and capacitor means coupled to said outer transverse conductor, said capacitors and said capacitor means having capacitance values chosen so that a current through the outer transverse conductor is uniformly distributed to the other transverse conductors.

2. A surface coil system for magnetic resonance examinations as claimed in claim 1, wherein the longitudinal conductors and the outer transverse conductor are constructed so that the magnetic fields associated with the current flow through these conductors are at least partly suppressed in the plane containing the other remaining transverse conductors.

3. A surface coil system as claimed in claim 2, wherein the two longitudinal conductors and the outer transverse conductor are outside and to the same side of the plane defined by the other remaining transverse conductors.

4. A surface coil system as claimed in claim 2, wherein the longitudinal conductors and the outer transverse conductor are formed by shielded cables.

5. The surface coil system as claimed in claim 1 two including of said surface coils which have been rotated with respect to one another through 90° about a normal to their surfaces forming a quadrature surface coil system.

6. A surface coil system as claimed in claim 3 wherein the longitudinal conductors and the outer transverse conductor are formed by shielded cables.

7. The system of claim 1 wherein the currents in said plurality of transverse conductors have substantially the same intensity and phase such that the sum of these currents corresponds to the current through said outer transverse conductor.

8. The system of claim 1 wherein the currents in said conductors are such that a point on each said longitudinal conductor intermediate a first transverse conductor and said outer conductor is at virtual ground.

9. The system of claim 1 wherein the capacitors included in said transverse conductors differ in value.

10. A surface coil system as claimed in claim 1 wherein said two longitudinal conductors are in parallel and said transverse conductors are arranged in a plane.

11. A surface coil system as claimed in claim 1 wherein the capacitance value of the capacitor in the transverse conductor nearest to the outer transverse conductor is higher than the capacitance values of the capacitors in the other remaining transverse conductors.

12. A surface coil system as claimed in claim 11 wherein said capacitor means of the coupling means includes a capacitor having a capacitance value of the order of magnitude of the sum of the capacitance values of the capacitors in said transverse conductors.

13. A surface coil system as claimed in claim 10 wherein said transverse conductors are in parallel and RF currents flowing therein produce an RF magnetic field which extends parallel to the plane of the transverse conductors and perpendicular to the transverse conductors.

14. A surface coil system as claimed in claim 10 wherein the two longitudinal conductors lie in a second plane spaced apart from the plane of the transverse conductors and the outer transverse conductor is positioned outside of said plane of the other transverse conductors.

15. A surface coil system comprising first and second surface coils each as defined in claim 1, said first and second surface coils being arranged in parallel planes and at right angles to one another so as to form a quadrature surface coil system.

16. A surface coil system as claimed in claim 15 further comprising second capacitor means coupling the first and second surface coils and having a capacitance value chosen so as to decouple the first and second surface coils.

17. In a nuclear magnetic resonance examining apparatus having a tubular magnet for generating a uniform, steady magnetic field extending perpendicular to the axis of the tubular magnet, the improvement comprising:

a surface coil system arranged to produce a magnetic field which extends perpendicular to said uniform, steady magnetic field, said surface coil system comprising:

two parallel arranged longitudinal conductors, a plurality of parallel transverse conductors lying in a plane and interconnecting the longitudinal conductors to form a surface coil, a plurality of capacitors, and coupling means for coupling the coil formed by said conductors to an RF transmitter or RF receiver, said transverse conductors each including at least one capacitor of said plurality of capacitors, said coupling means including an outer transverse conductor and capacitor means coupled to said outer transverse conductor, said capacitors and said capacitor means having capacitance values chosen so that a current through the outer transverse conductor is uniformly distributed to the other transverse conductors.

18. A surface coil system as claimed in claim 17 wherein said capacitor means coupled to the outer transverse conductor comprises first and second capacitors connected in series with the outer transverse conductor to said two longitudinal conductors and a third capacitor coupling the outer transverse conductor to said RF transmitter or RF receiver, a junction between said first and second capacitors being connected to ground.

* * * * *